US012693137B2

(12) United States Patent     (10) Patent No.:   US 12,693,137 B2
     Koike et al.                (45) Date of Patent:      Jul. 28, 2026

(54) INPUT DEVICE CONFIGURED TO DETERMINE ROTATION OPERATION AND PUSH OPERATION USING MAGNETIC SENSOR

(71) Applicant: ALPS ALPINE CO., LTD., Tokyo (JP)

(72) Inventors: Asuka Koike, Miyagi (JP); Yasuhiro Ishizawa, Miyagi (JP); Takashi Sato, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 161 days.

(21) Appl. No.: 18/748,869

(22) Filed: Jun. 20, 2024

(65) Prior Publication Data

US 2024/0337507 A1     Oct. 10, 2024

Related U.S. Application Data

(63) Continuation of application No. PCT/JP2022/039124, filed on Oct. 20, 2022.

(30) Foreign Application Priority Data

Dec. 22, 2021    (JP) ................................. 2021-208702

(51) Int. Cl.
    *G01D 5/14*        (2006.01)
    *G01R 33/00*      (2006.01)
(52) U.S. Cl.
    CPC ......... *G01D 5/147* (2013.01); *G01R 33/0047* (2013.01); *G01D 2205/10* (2021.05); *G01D 2205/20* (2021.05)
(58) Field of Classification Search
    CPC ............... G01D 5/147; G01D 2205/10; G01D 2205/20; G01D 5/145; G01R 33/0047;
                 (Continued)

(56) References Cited

U.S. PATENT DOCUMENTS

| 2019/0379377 A1 | 12/2019 | Ju et al. | |
| 2020/0043305 A1* | 2/2020 | Wakuda | F16D 57/002 |

(Continued)

FOREIGN PATENT DOCUMENTS

| JP | 2008-140697 | 6/2008 |
| JP | 2008-218199 | 9/2008 |

(Continued)

OTHER PUBLICATIONS

International Search Report for PCT/JP2022/039124 mailed on Dec. 13, 2022.

*Primary Examiner* — Alvaro E Fortich
(74) *Attorney, Agent, or Firm* — IPUSA, PLLC

(57) ABSTRACT

An input device includes an operation nob configured to perform a rotation operation and a push operation; one magnet provided so as to perform a rotational movement in response to the rotation operation and to perform a sliding movement in response to the push operation, from an initial state; a magnetic sensor disposed on a substrate and configured to detect a magnetic field generated by the magnet; and circuitry configured to determine operation contents of the rotation operation and the push operation based on a detection result of the magnetic sensor, wherein the magnet is disposed such that a rotation axis serving as a rotation center when performing the rotational movement passes through the magnet, and magnetization directions of an N pole and an S pole of the magnet are inclined with respect to the rotation axis of the rotational movement and a direction of the sliding movement.

9 Claims, 12 Drawing Sheets

100

(58) Field of Classification Search
CPC .... G06F 3/0338; G06F 3/0362; G06F 3/0383;
H01H 25/00
See application file for complete search history.

(56) References Cited

U.S. PATENT DOCUMENTS

| | | | | |
|---|---|---|---|---|
| 2020/0318729 | A1* | 10/2020 | Endo ..................... | G01R 33/07 |
| 2021/0262832 | A1* | 8/2021 | Heinz .................... | G05G 9/047 |
| 2022/0342437 | A1* | 10/2022 | Xie .......................... | G05G 1/02 |

FOREIGN PATENT DOCUMENTS

| | | |
|---|---|---|
| JP | 2009-140785 | 6/2009 |
| JP | 2010-032234 | 2/2010 |
| JP | 2018-087706 | 6/2018 |

* cited by examiner

ACTUAL ROTATION ANGLE [deg]

ACTUAL ROTATION ANGLE [deg]

INCLINATION COMPARISON OF MAGNETIZATION DIRECTIONS
(15, 30, 45, 60, 75 deg)

SLIDING AMOUNT [mm]

INPUT DEVICE CONFIGURED TO DETERMINE ROTATION OPERATION AND PUSH OPERATION USING MAGNETIC SENSOR

CROSS-REFERENCE TO RELATED APPLICATIONS

This application is a continuation application of International Application No. PCT/JP2022/039124, filed on Oct. 20, 2022, and designated the U.S., which is based upon and claims priority to Japanese Patent Application No. 2021-208702, filed on Dec. 22, 2021, the entire contents of which are incorporated herein by reference.

BACKGROUND

1. Field of the Invention

The present disclosure relates to an input device.

2. Description of the Related Art

Japanese Unexamined Patent Application Publication No. 2009-140785, for example, discloses a technique relating to a rotary push switch capable of performing a rotation operation and a push operation by an operation unit. The rotary push switch includes a counter magnet disposed in the operation unit, and a change in the direction of a magnetic field of the counter magnet is detected by magnetic sensors in accordance with the rotation operation and the push operation such that any position in a rotation axis direction based on the push operation and any rotation position based on the rotation operation are detected based on detection results of the magnetic sensors.

SUMMARY

According to at least one embodiment of the present invention, an input device includes an operation nob configured to perform a rotation operation and a push operation;

one magnet provided so as to perform a rotational movement in response to the rotation operation and to perform a sliding movement in response to the push operation, from an initial state;

a magnetic sensor disposed on a substrate and configured to detect a magnetic field generated by the magnet; and circuitry configured to determine operation content of the rotation operation and operation content of the push operation based on a detection result of the magnetic sensor, wherein the magnet is disposed such that a rotation axis serving as a rotation center when performing the rotational movement passes through the magnet, and magnetization directions of an N pole and an S pole of the magnet are inclined with respect to the rotation axis of the rotational movement and a direction of the sliding movement.

DESCRIPTION OF EMBODIMENTS

In the related art technique; however, the rotary push switch disclosed in Patent Document needs to have two magnetic sensors for detecting the rotation operation and two magnetic sensors for detecting the push operation; that is, four magnetic sensors are required for detecting both the rotation operation and the push operation. Thus, the rotary push switch disclosed in Patent Document 1 may fail to detect each of the rotation operation and the push operation with high accuracy by using a small number of magnetic sensors.

According to at least one embodiment, each of the rotation operation and the push operation can be detected with high accuracy by using a small number of magnetic sensors.

Hereinafter, an embodiment will be described with reference to the accompanying drawings.

First Embodiment (Configuration of Input Device 100)

Figure 1:
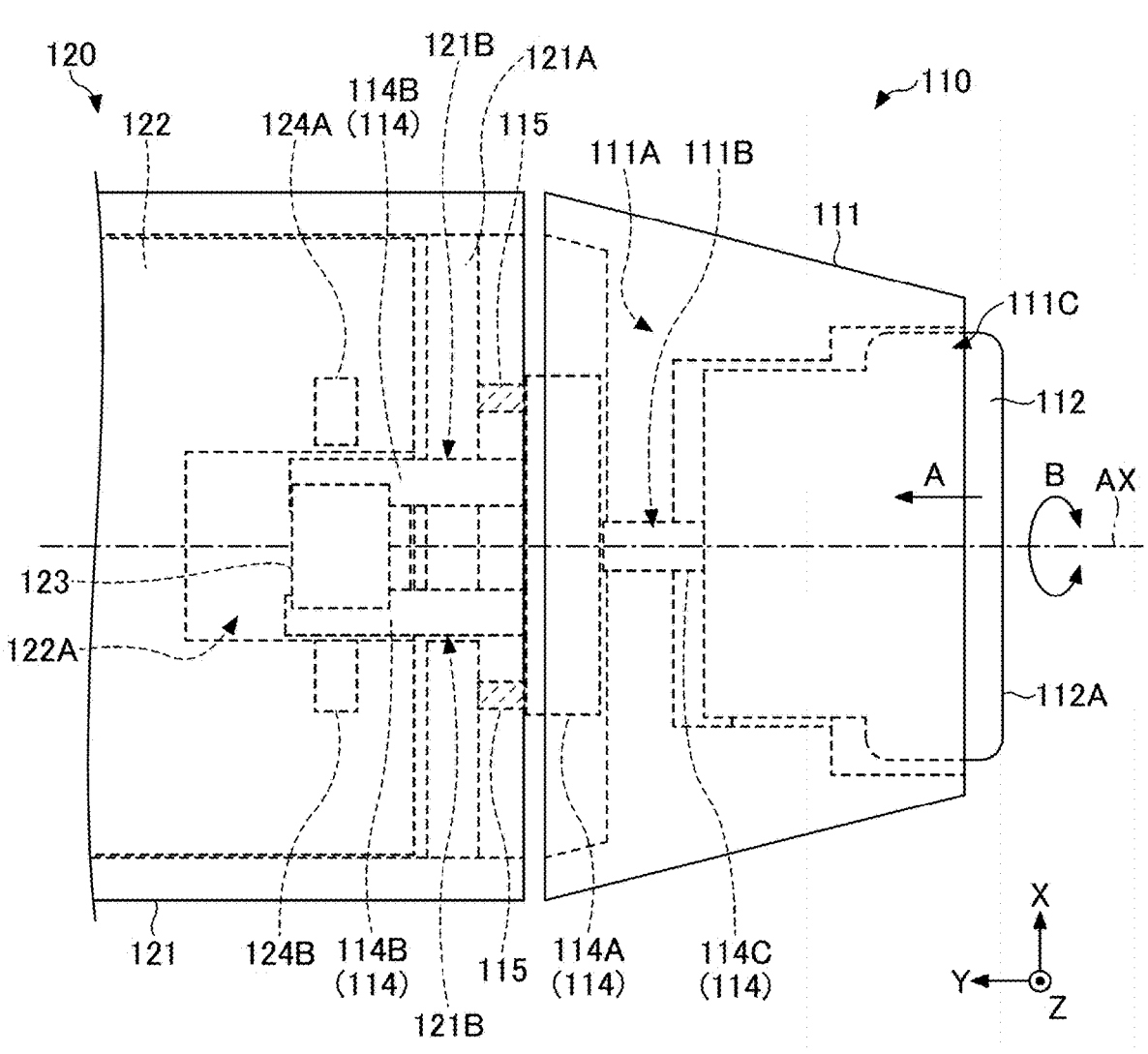
FIG. 1 is a plan view illustrating an input device according to a first embodiment.
Figure 2:
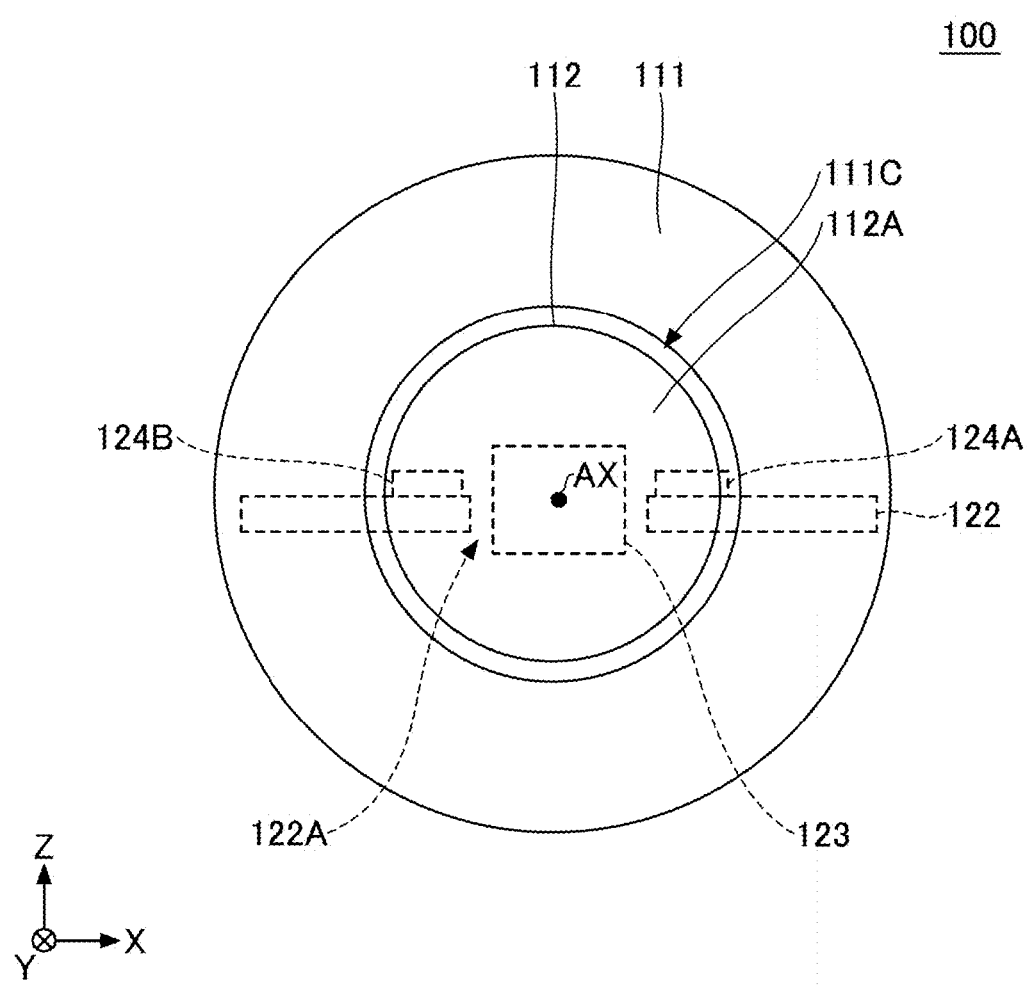
FIG. 2 is a front view illustrating the input device according to the first embodiment.

FIG. 1 is a plan view illustrating an input device 100 according to a first embodiment. FIG. 2 is a front view illustrating the input device 100 according to the first embodiment. In the following description, for convenience, an X-axis direction is a left-right direction, a Y-axis direction is a front-rear direction, and a Z-axis direction is an up-down direction. Note that an X-axis positive direction is a right direction, and a Y-axis positive direction is a front direction, and a Z-axis positive direction is an upward direction. These directional definitions are intended to illustrate the relative positional relationship in the device, and do not limit the installation direction or operation direction of the device, and all of those having the same relative positional relationship in the device and those having different installation directions or operation directions are included in the scope of the right of the present disclosure.

The input device 100 illustrated in FIG. 1 includes an operation unit 110 (an example of an operation nob) and a main body 120. The operation unit 110 and the main body 120 are provided side by side in an axial direction (Y-axis direction) of the rotation axis AX. The operation unit 110 is configured to perform a rotation operation and a push operation. Specifically, the operation unit 110 includes a rotation operation knob 111 and a push operation knob 112, and is configured to perform a rotation operation in a direction B of rotational movement, which is a direction around the rotation axis AX by the rotation operation knob 111, and a push operation in a direction A (Y-axis positive direction) of sliding movement by the push operation knob 112.

<Configuration of Operation Unit 110>

As illustrated in FIGS. 1 and 2, the operation unit 110 acting as the operation knob includes a rotation operation knob 111, a push operation knob 112, a retainer 114, and a coil spring 115.

The rotation operation knob 111 is a cylindrical member made of resin and centered on the rotation axis AX. The rotation operation knob 111 is provided to be rotatable in a direction around the rotation axis AX, and is rotated by a user. In the example illustrated in FIGS. 1 and 2, the rotation operation knob 111 has a truncated cone shape whose diameter gradually increases from a rear end (the end portion on the negative side of the Y axis) toward a front end (the end portion on the Y axis positive side). An opening on the front side (Y-axis positive side) of the rotation operation knob 111 is closed by the partition 111A. A through hole 111B penetrating the partition 111A in the front-rear direction (Y-axis direction) is formed at the center of the partition 111A.

The push operation knob 112 is a substantially cylindrical member made of resin and centered on the rotation axis AX. The push operation knob 112 is provided in the cylinder of the rotation operation knob 111 so as to be slidable in the axial direction (Y-axis direction) of the rotation axis AX. The rear end of the push operation knob 112 protrudes rearward (in the negative Y-axis direction) from the opening 111C on the rear side (negative Y-axis side) of the rotation operation knob 111. The rear end surface of the push operation knob 112 is an operation surface 112A for receiving a push operation. The push operation knob 112 is pushed by the user pushing the operation surface 112A forward (in the Y-axis positive direction), and slides forward (in the Y-axis positive direction) along the rotation axis AX.

The retainer 114 is a resin-made member having a rotation portion 114A, a pair of retaining arms 114B, and a shaft portion 114C.

The rotation portion 114A is a disc-shaped portion disposed between a partition 111A of the rotation operation knob 111 and a partition 121A of a case 121 around the rotation axis AX.

The pair of retaining arms 114B are arm-shaped portions such that the rotation axis AX is interposed between the pair of retaining arms 114B, extend linearly forward (in the Y-axis positive direction) from the rotation portion 114A, pass through the insertion hole 121B formed in the partition 121A of the case 121, and extend into a cutout portion 122A of a substrate 122. The pair of retaining arms 114B retain a magnet 123 inside the cutout portion 122A of the substrate 122.

The shaft portion 114C is a rod-shaped portion having a D-shaped cross-section, which linearly extends rearward (in the negative Y-axis direction) from the rotation portion 114A on the rotation axis AX, passes through a through hole 111B formed in the partition 111A of the rotation operation knob 111, and is connected to the push operation knob 112.

The retainer 114 is spline-coupled to the through hole 111B of the rotation operation knob 111 having a D-shaped cross section at the shaft portion 114C. Thus, the retainer 114 is supported so as to rotationally move integrally with the rotation operation knob 111.

The retainer 114 is connected to the push operation knob 112 at the rear end of the shaft portion 114C. Thus, the retainer 114 is supported so as to be slidable in the front-rear direction (Y-axis direction) integrally with the push operation knob 112.

The coil spring 115 is disposed between the rotation portion 114A of the retainer 114 and the partition 121A of the case 121. The coil spring 115 preloads the rotation portion 114A of the retainer 114 in the return direction of the push operation (the Y-axis negative direction). This enables the coil spring 115 to return the push operation knob 112 to the initial position before the push operation when the push operation by the push operation knob 112 is released.

<Configuration of Main Body 120>

As illustrated in FIGS. 1 and 2, the main body 120 includes the case 121, the substrate 122, the magnet 123, and two magnetic sensors 124 (a first magnetic sensor 124A and a second magnetic sensor 124B).

The case 121 is a container-shaped resin member having a hollow structure. In the present embodiment, the case 121 has a cylindrical shape, but the shape of the case 121 is not limited to the cylindrical shape. The case 121 houses the substrate 122, the magnet 123, the first magnetic sensor 124A, and the second magnetic sensor 124B. An opening on the rear side (the Y-axis negative side) of the case 121 is closed by the partition 121A. The partition 121A is formed with an insertion hole 121B through which the pair of left and right retaining arms 114B of the retainer 114 are inserted.

The substrate 122 is a flat plate-shaped member. The substrate 122 is installed in a posture horizontal to an XY plane inside the case 121. The substrate 122 has a quadrangular shape in a plan view from above (the positive direction of the Z-axis). However, the shape of the substrate 122 is not limited to the quadrangular shape. As the substrate 122, for example, a printed wiring board (PWB) is used.

The magnet 123 is a so-called permanent magnet, and is magnetized such that a pair of N pole and S pole are adjacent to each other from the center to both ends, and generates a substantially arc-shaped magnetic field from the N pole to the S pole around the magnet 123. The magnet 123 is disposed inside the cutout portion 122A formed at the end portion on the rear side (the Y-axis negative side) of the substrate 122. The magnet 123 is retained by a pair of left and right retaining arms 114B of the retainer 114 inside the cutout portion 122A. Thus, the magnet 123 can rotationally move inside the cutout portion 122A in response to the rotation operation by the rotation operation knob 111 and can slidably move inside the cutout portion 122A in response to the push operation by the push operation knob 112.

The first magnetic sensor 124A and the second magnetic sensor 124B are disposed on the substrate 122 so as to face each other with the magnet 123 and the cutout portion 122A interposed between the first magnetic sensor 124A and the second magnetic sensor 124B. The first magnetic sensor 124A and the second magnetic sensor 124B detect directions of the magnetism generated by the magnet 123 by detecting the directions of the magnetic field on the XY plane passing through the first magnetic sensor 124A and the second magnetic sensor 124B. The first magnetic sensor 124A and the second magnetic sensor 124B output detection signals indicating the detected directions of the magnetism to the control device 130 (see FIG. 6). In the present embodiment, a giant magneto resistive effect (GMR) sensor is used as the first magnetic sensor 124A and the second magnetic sensor 124B.

<Operation of Input Device 100>

In the input device 100, when the rotation operation knob 111 is rotated, the retainer 114 rotates together with the rotation operation knob 111, This rotationally moves the magnet 123, which is retained by the pair of retaining arms 114B of the retainer 114 and provided such that the rotation axis AX serving as the rotation center passes through the magnet, in the rotational movement direction B about the rotation axis AX. Thus, the input device 100 can detect changes in the direction of the magnetic field generated from the magnet 123, which is generated by the rotational movement of the magnet as 123, rotational operations by the rotation operation knob 111 by detecting the directions of the magnetic field before and after the movement by the first magnetic sensor 124A and second magnetic sensor 124B.

In the input device 100, when the push operation is performed by the push operation knob 112, the retainer 114 slides in the direction A of the sliding movement (Y-axis positive direction) together with the push operation knob 112, and the magnet 123 retained by the pair of retaining arms 114B of the retainer 114 slide in the direction A of the sliding movement (Y-axis positive direction) along the rotation axis AX. The input device 100 can detect changes in the direction of the magnetic field generated from the magnet 123, which is generated by the sliding movement of the magnet 123, as a push operation by the push operation knob 112 by detecting the directions of the magnetic field before and after the movement by the first magnetic sensor 124A and the second magnetic sensor 124B.

(Arrangement of Magnet 123 and Magnetic Sensors 124A and 124B)

Figure 3:
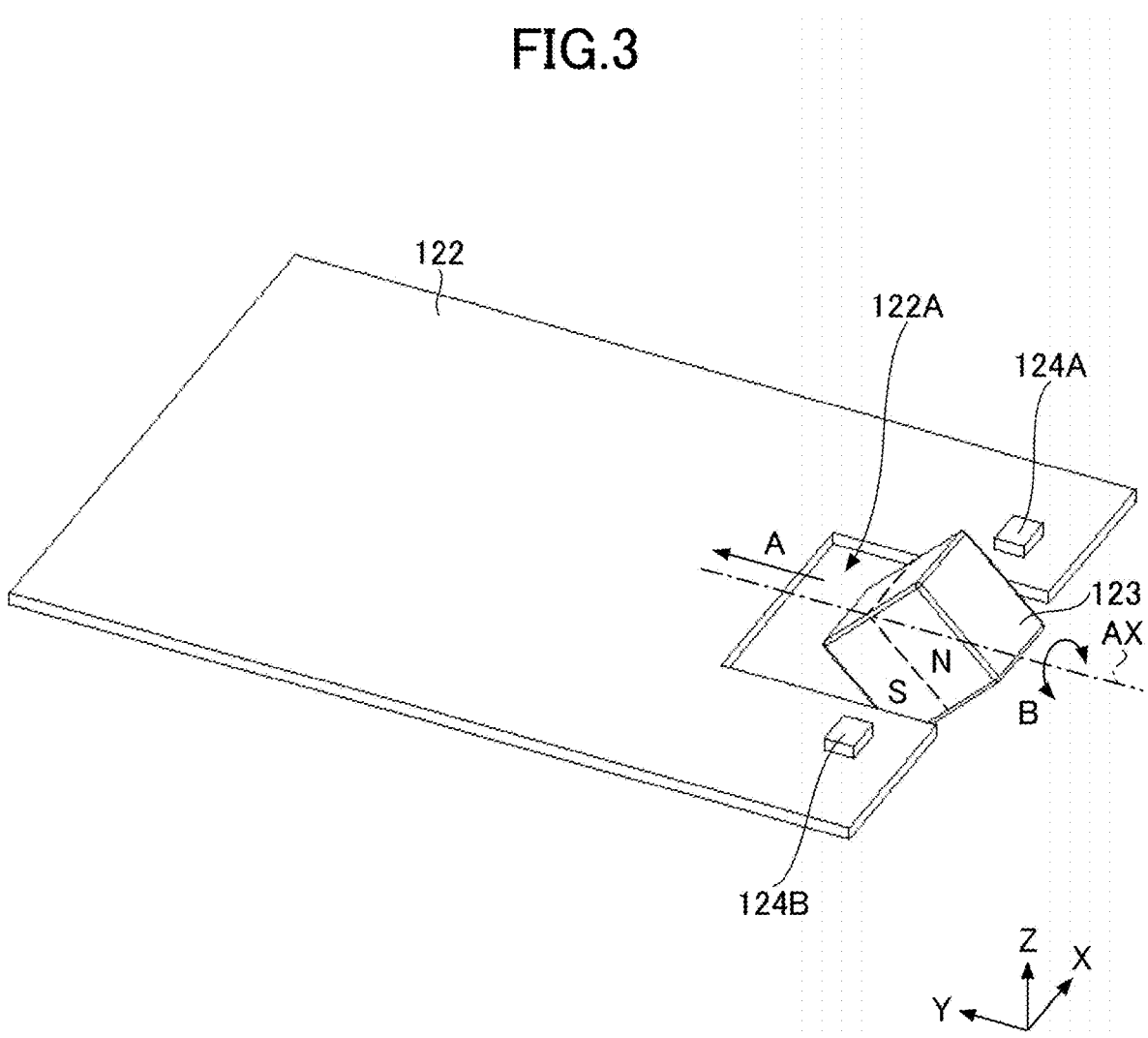
FIG. 3 is an external perspective view illustrating an arrangement of a magnet and magnetic sensors in the input device according to the first embodiment.
Figure 4:
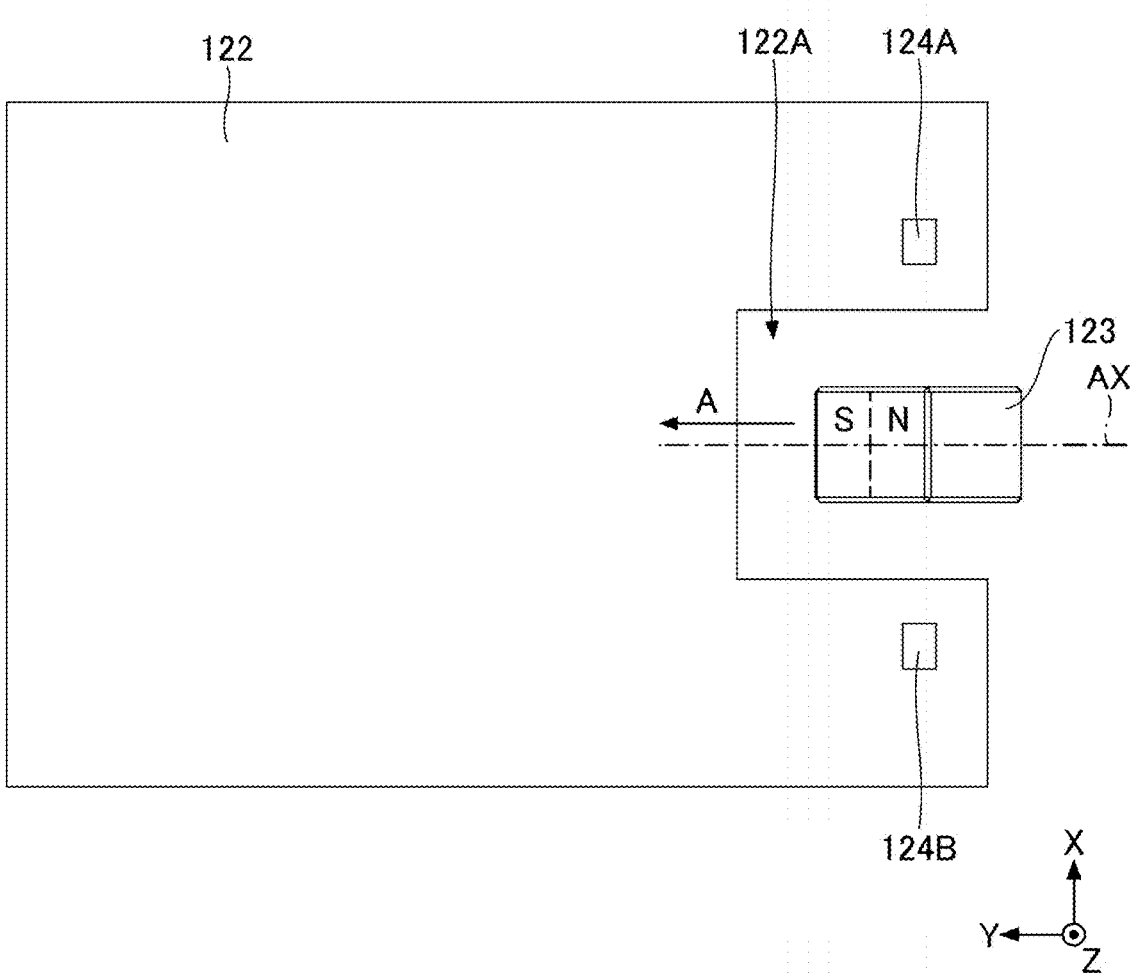
FIG. 4 is a plan view illustrating the arrangement of the magnet and the magnetic sensors in the input device according to the first embodiment.
Figure 5:
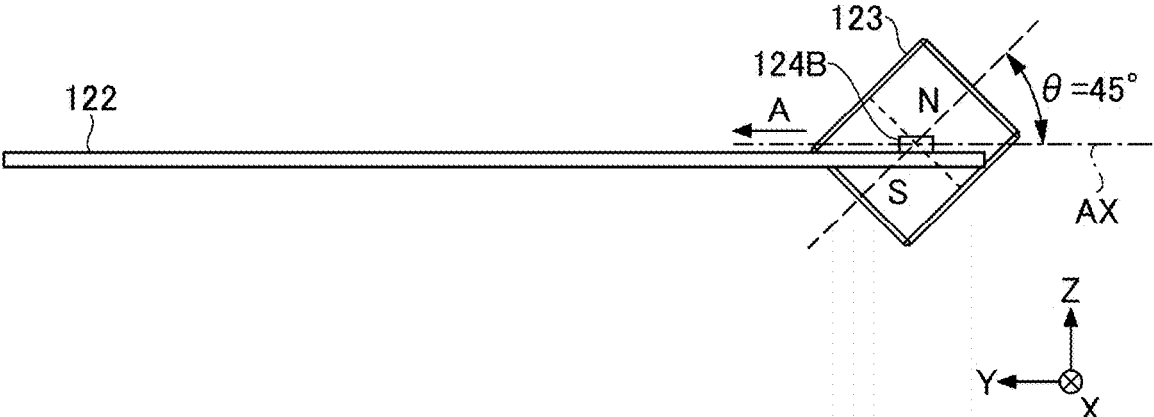
FIG. 5 is a side view illustrating the arrangement of the magnet and the magnetic sensor in the input device according to the first embodiment.

FIG. 3 is an external perspective view illustrating an arrangement of the magnet 123 and the magnetic sensors 124A and 124B in the input device 100 according to the first embodiment. FIG. 4 is a plan view illustrating the arrangement of the magnet 123 and the magnetic sensors 124A and 124B in the input device 100 according to the first embodiment. FIG. 5 is a side view illustrating the arrangement of the magnet 123 and the magnetic sensors 124A and 124B in the input device 100 according to the first embodiment. FIGS. 3 to 5 illustrate the arrangement of the magnet 123 and the magnetic sensors 124A and 124B by selectively illustrating the substrate 122, the magnet 123, and the magnetic sensors 124A and 124B.

As illustrated in FIGS. 3 and 4, the cutout portion 122A which is partially cut out toward the front side (Y-axis positive direction) is formed at an end portion on the rear side (Y-axis negative side) of the substrate 122 and at a central portion in the right-left direction (X-axis direction). The cutout portion 122A has a quadrangular shape in a plan view from above (a Z-axis positive direction). However, the shape of the cutout portion 122A is not limited to the quadrangular shape.

The magnet 123 is disposed inside the cutout portion 122A, and the magnet 123 rotationally moves and slidably moves. Therefore, the cutout portion 122A is formed to have a sufficient size in both the front-rear direction (Y-axis direction) and the right-left direction (X-axis direction) such that the substrate 122 does not interfere with the rotational movement and the sliding movement of the magnet 123.

Specifically, inside the cutout portion 122A, the magnet 123 slides in the direction A of sliding movement, which is forward (Y-axis positive direction), in accordance with the push operation by the push operation knob 112 (see an arrow A illustrated in FIGS. 3 to 5).

Inside the cutout portion 122A, the magnet 123 rotates in a rotational movement direction B (see arrow B in FIG. 3) about a rotation axis AX that extends linearly in the front-rear direction (Y-axis direction) and passes through the center of the magnet 123, as viewed d from the rear (negative Y-axis direction), in accordance with the rotation operation of the rotation operation knob 111.

As illustrated in FIGS. 3 to 5, the direction A of the sliding movement of the magnet 123, the rotation axis AX of the rotational movement of the magnet 123, and the substrate 122 are parallel to each other.

Further, FIGS. 3 to 5 illustrate an initial state of the magnet 123 (i.e., a state in which the magnet is not slid and rotated). As illustrated in FIGS. 3 to 5, the magnet 123 has a rectangular parallelepiped shape. As illustrated in FIG. 5, the magnet 123 is magnetized to have an N pole at the upper portion and an S pole at the lower portion with the central portion in the vertical direction as a boundary.

However, as illustrated in FIGS. 3 to 5, in the initial state of the magnet 123, the magnetization directions of the N pole and the S pole of the magnet 123 are inclined at a predetermined angle with respect to the rotation axis AX of the rotational movement and the direction A of the sliding movement. Here, the magnetization directions of the N pole and the S pole are the arrangement directions of the N pole and the S pole.

In the present embodiment, the magnet 123 is provided in a state of being rotated by 45 degrees counterclockwise from the Y-axis direction when viewed from the negative X-axis side in the initial state. That is, the magnetization directions of the N pole and the S pole of the magnet 123 have an inclination angle $\theta$ of 45 degrees with respect to the rotation axis AX of the rotational movement and the direction A of the sliding movement. (See FIG. 5)

In addition, on the substrate 122, the first magnetic sensor 124A is disposed on the right side (positive X-axis side) of the cutout portion 122A. In addition, on the substrate 122, the second magnetic sensor 124B is disposed on the left side (negative X-axis side) of the cutout portion 122A. That is, the first magnetic sensor 124A and the second magnetic sensor 124B are disposed to face each other with the magnet 123 and the cutout portion 122A interposed between the first magnetic sensor 124A and the second magnetic sensor 124B.

As illustrated in FIG. 5, the second magnetic sensor 124B is disposed at a position overlapping the center of the magnet 123 when viewed from the left side (negative X-axis side). Similarly, the first magnetic sensor 124A is disposed at a position overlapping the center of the magnet 123 when viewed from the right side (negative X-axis side). That is, the first magnetic sensor 124A and the second magnetic sensor 124B are disposed at positions overlapping the magnet 123 in the initial state standing by inside the cutout portion 122A when viewed from the direction parallel to the substrate 122 and the direction orthogonal to the rotation axis AX.

The first magnetic sensor 124A and the second magnetic sensor 124B are disposed in respective portions of the substrate 122 on the sides (in the X-axis positive direction and the X-axis negative direction) of the cutout portion 122A in close proximity to and facing the magnet 123 in the initial state standing by inside the cutout portion 122A.

The first magnetic sensor 124A and the second magnetic sensor 124B are magnetic sensors having the same specifications. However, the first magnetic sensor 124A and the second magnetic sensor 124B are disposed in opposite directions relative to the magnet 123. More specifically, the first magnetic sensor 124A is disposed facing the left direction (X-axis negative direction), which is the direction in which the magnet 123 is present when viewed from the first magnetic sensor 124A. On the other hand, the second magnetic sensor 124B is disposed facing the left direction (X-axis negative direction), which is the direction in which the magnet 123 is not present when viewed from the second magnetic sensor 124B.

Thus, in the input device 100 according to the first embodiment, the detection value of one of the two magnetic sensors 124A and 124B increases with the sliding movement of the magnet 123, and the detection value of the other one of the two magnetic sensors 124A and 124B decreases with the sliding movement of the magnet 123 (see FIGS. 12 and 13 described later). Further, as the magnet 123 rotates, the detection values of the two magnetic sensors 124A and 124B both decrease or increase (see FIGS. 8 and 9 described later).
(Configuration of Control System Included in Input Device 100)

Figure 6:
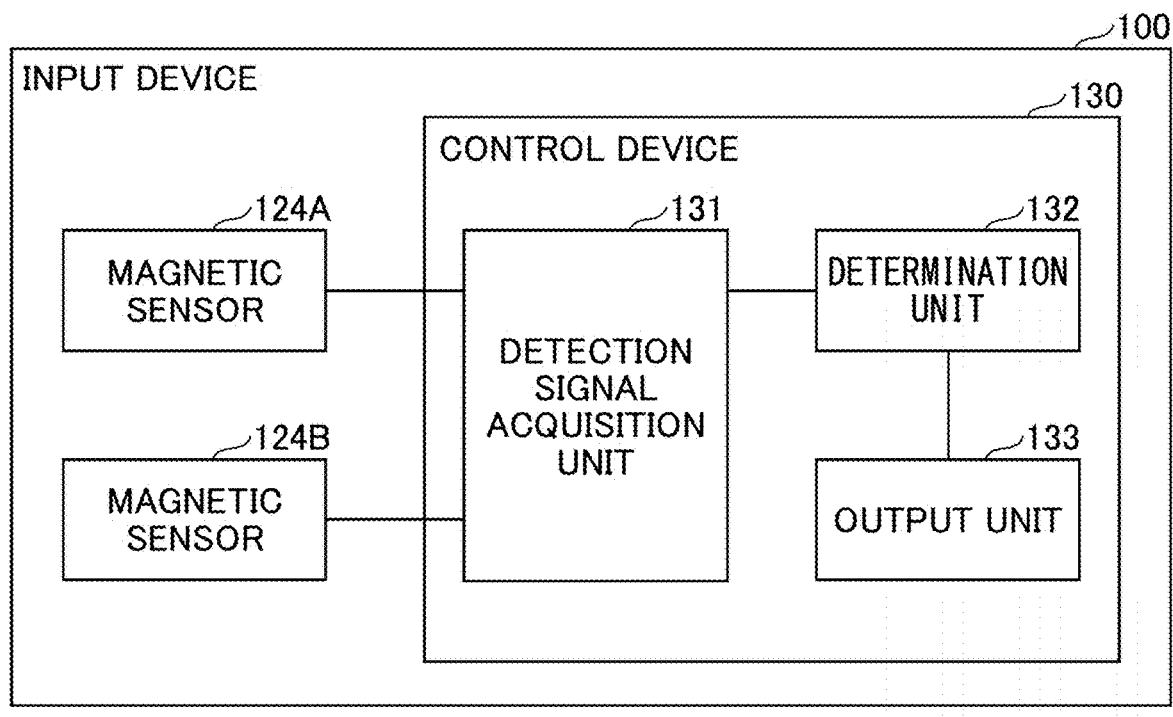
FIG. 6 is a diagram illustrating a configuration of a control system included in the input device according to the first embodiment.

FIG. 6 is a diagram illustrating a configuration of a control system included in the input device 100 according to the first embodiment. As illustrated in FIG. 6, the input device 100 includes a control device 130. The control device 130 is electrically coupled to each of the first magnetic sensor 124A and the second magnetic sensor 124B.

As illustrated in FIG. 6, the control device 130 includes a detection signal acquisition unit 131, a determination unit 132, and an output unit 133.

The detection signal acquisition unit 131 acquires a detection signal indicating a detection result of the direction of the magnetic field generated by the magnet 123 from each of the first magnetic sensor 124A and the second magnetic sensor 124B.

The determination unit 132 determines the operation content of the rotation operation by the rotation operation knob 111 and the operation content of the push operation by the push operation knob 112 based on the detection signal acquired by the detection signal acquisition unit 131. The operation content of the rotation operation is, for example, a rotation direction and a rotation angle. The operation content of the push operation is, for example, the amount of slide movement in the direction A of the slide movement.

Note that the determination unit 132 may determine, as the operation content of the rotation operation, which operation position of the plurality of operation positions the rotation operation has been performed on the basis of the determined rotation angle of the rotation operation.

The determination unit 132 may determine which operation position of the plurality of operation positions the push operation is performed as the operation content of the push operation based on the determined amount of sliding movement of the push operation.

The output unit 133 outputs the operation content of the rotation operation by the rotation operation knob 111 and the operation content of the push operation by the push operation knob 112 determined by the determination unit 132 to the outside (e.g., a device to be operated by the input device 100).

The control device 130 is implemented by a computer including, for example, a processor (e.g., a CPU), a storage medium (e.g., a read only memory (ROM), a random access memory (RAM), a solid state drive (SSD), or the like), an external interface, and the like. For example, each functional unit of the control device 130 illustrated in FIG. 6 is implemented by a processor (e.g., circuitry such as an integrated circuit (IC)) executing a program stored in a storage medium in the control device 130.
(Example of Rotational Movement of Magnet 123)

Figure 7A:
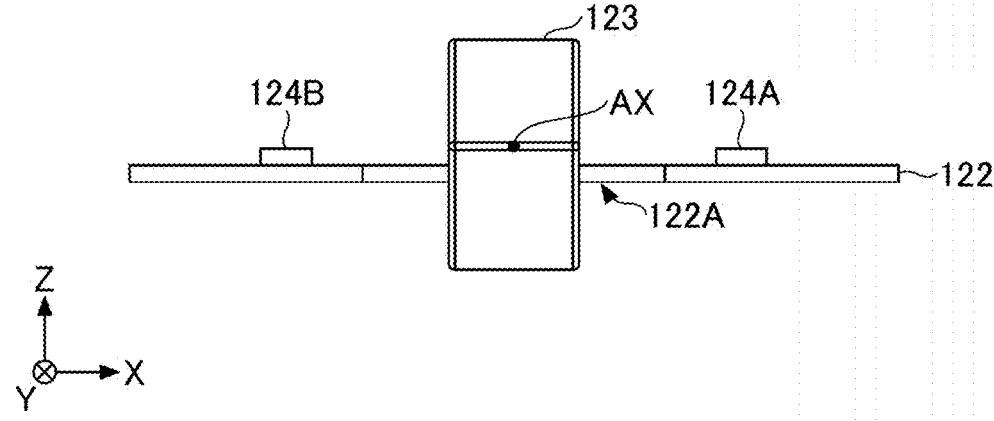
FIG. 7A is a view illustrating an example of a rotational movement of the magnet during a rotation operation in the input device according to the first embodiment.
Figure 7B:
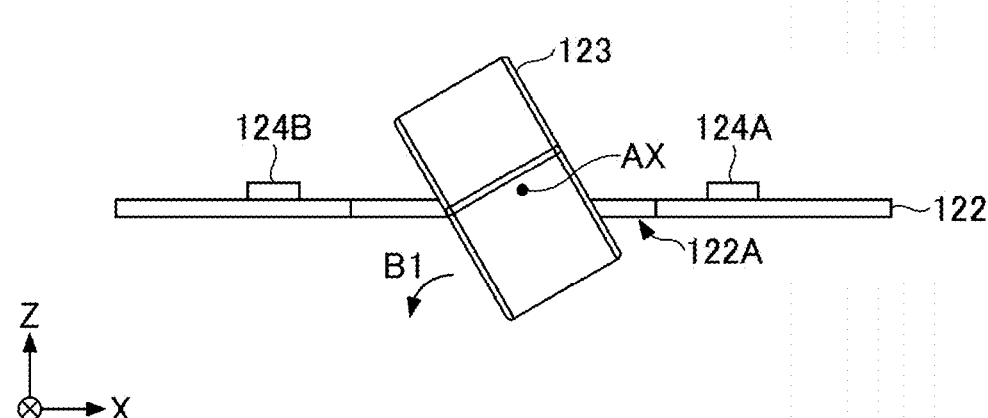
FIG. 7B is a view illustrating an example of a rotational movement of the magnet during the rotation operation in the input device according to the first embodiment.
Figure 7C:
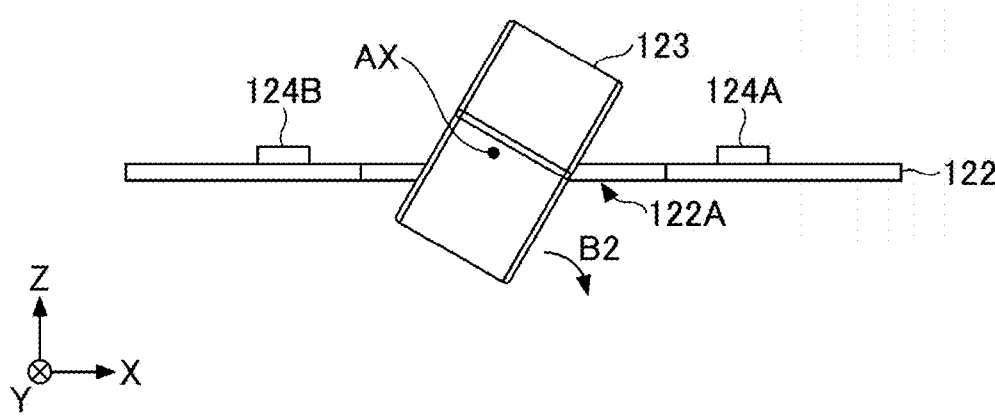
FIG. 7C is a view illustrating an example of rotational movement of the magnet during the rotation operation in the input device according to the first embodiment.

FIGS. 7A to 7C are diagrams each illustrating an example of rotational movement of the magnet 123 during a rotation operation in the input device 100 according to the first embodiment. FIG. 7A illustrates a state before the rotational movement of the magnet 123 (i.e., an initial state). FIG. 7B illustrates a state after the rotational movement of the magnet 123 in a counterclockwise direction. FIG. 7C illustrates a state after the rotational movement of the magnet 123 in a clockwise direction.

FIG. 7A illustrates a state in which the initial state before the rotational movement of the magnet 123 illustrated in FIG. 5 (i.e., a state inclined by 45 degrees with respect to the rotation axis AX and the direction A of the sliding movement) is viewed from the rotation axis AX direction.

As illustrated in FIG. 7B, the input device 100 according to the first embodiment can rotationally move the magnet 123 the in counterclockwise direction B1 about the rotation axis AX while being inclined by 45 degrees with respect to the rotation axis AX and the direction A of the sliding movement, in accordance with the rotation operation in the counterclockwise direction by the rotation operation knob 111.

As illustrated in FIG. 7C, the input device 100 according to the first embodiment can rotationally move the magnet 123 in the clockwise direction B2 about the rotation axis AX while being inclined by 45 degrees with respect to the rotation axis AX and the direction A of the sliding movement in accordance with the rotation operation in the clockwise direction by the rotation operation knob 111.

The input device 100 according to the first embodiment can detect, by the first magnetic sensor 124A and the second magnetic sensor 124B disposed on the substrate 122, the direction of the magnetic field generated by the magnet 123, which changes when the magnet 123 rotationally moves.

Here, in the input device 100 according to the first embodiment, as the first magnetic sensor 124A and the second magnetic sensor 124B, a GMR (Giant Magneto Resistive effect) sensor may be used. Therefore, the first magnetic sensor 124A and the second magnetic sensor 124B can detect the direction of the magnetic field generated by the magnet 123 on the XY plane, which changes when the magnet 123 rotationally moves.

In this case, as the angle of the rotational movement of the magnet 123 increases, the relative angle of the magnet 123 with respect to each of the first magnetic sensor 124A and the second magnetic sensor 124B increases. Therefore, the angles indicating the directions of the magnetic field detected by the first magnetic sensor 124A and the second magnetic sensor 124B increase as the angle of the rotational movement of the magnet 123 increases (see FIGS. 8 and 9 described later).

(Example of Detection Values of Magnetic Sensors 124A and 124B During Rotation Operation)

Figure 8:
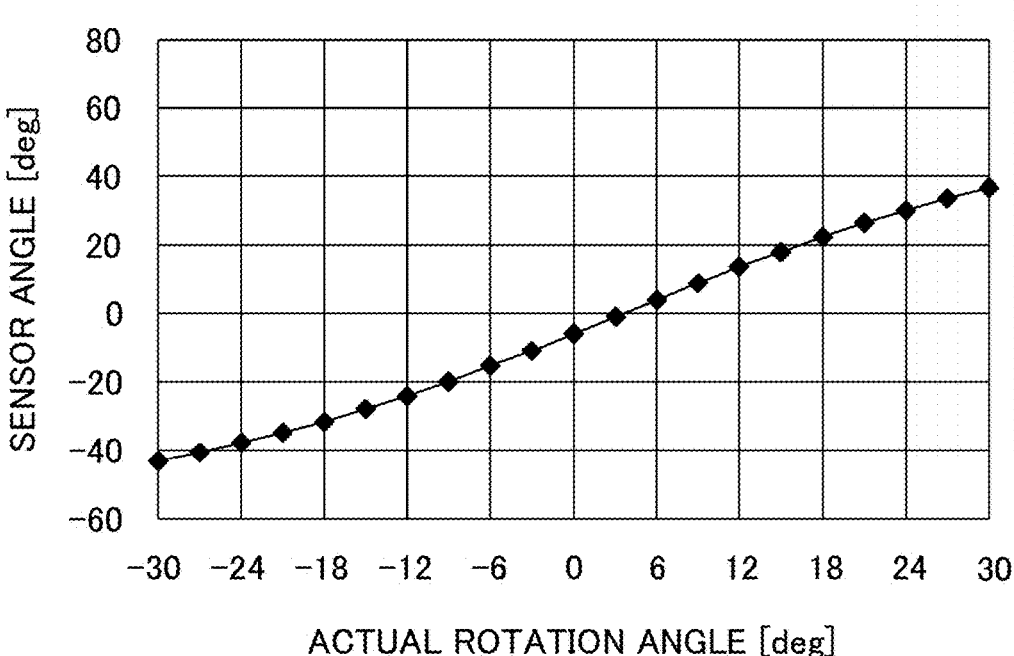
FIG. 8 is a graph illustrating an example of a detection value of a first magnetic sensor during the rotation operation in the input device according to the first embodiment.
Figure 9:
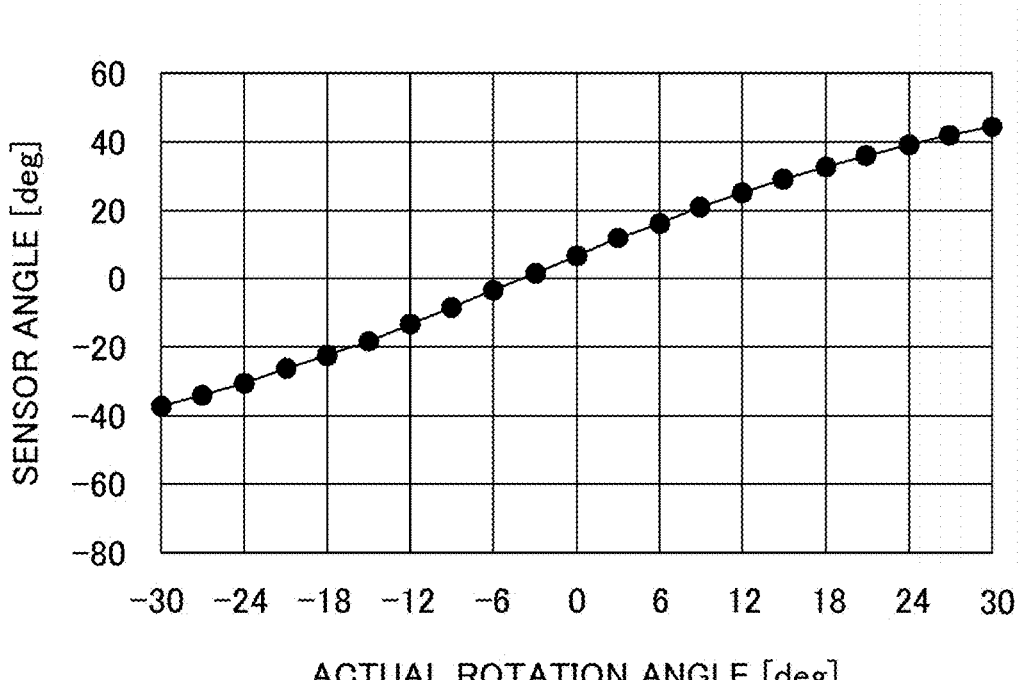
FIG. 9 is a graph illustrating an example of a detection value of a second magnetic sensor during the rotation operation in the input device according to the first embodiment.
Figure 10:
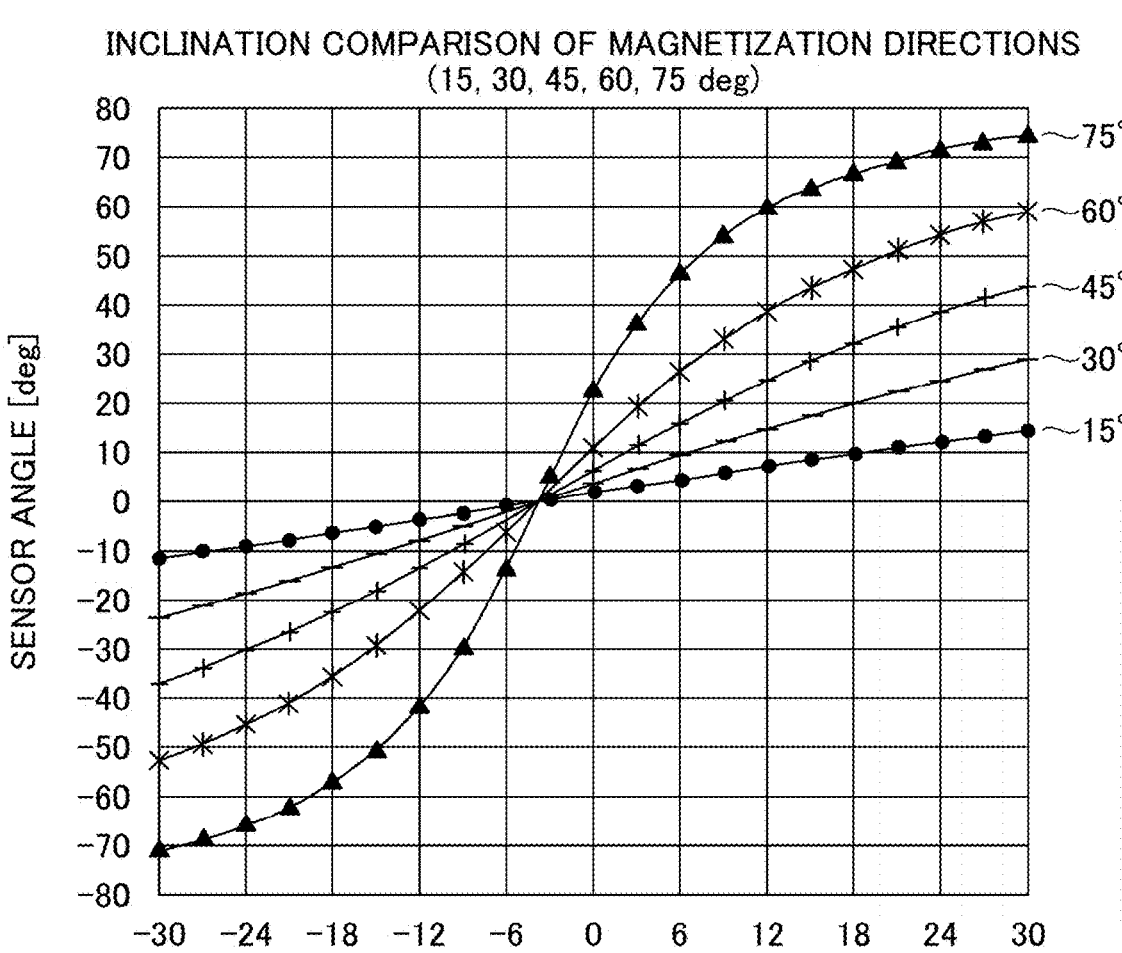
FIG. 10 is a graph illustrating comparative examples of detection values of the magnetic sensors during the rotation operation in the input device according to the first embodiment.

FIG. 8 is a graph illustrating examples of detection values of the first magnetic sensor 124A during a rotation operation in the input device 100 according to the first embodiment. FIG. 9 is a graph illustrating examples of detection values of the second magnetic sensor during a rotation 124B operation in the input device 100 according to the first embodiment. FIG. 10 is a graph illustrating comparative examples of detection values of the magnetic sensor 124 during a rotation operation when the inclinations of the magnetization directions of the N pole and the S pole of the magnet 123 in the input device 100 according to the first embodiment are changed. In each of the drawings, the horizontal axis of the graph represents the actual rotation angle of the magnet, the vertical axis of the graph represents the detection result of the direction of the magnetic field by the magnetic sensor 124A or 124B, and the horizontal axis represents 0 degrees when the magnet is in the initial state. Note that FIGS. 8 and 9 each illustrate examples of the detection values of the first magnetic sensor 124A and the second magnetic sensor 124B when the inclination angle θ of the magnetization directions of the N pole and the S pole of the magnet 123 is set to 45 degrees with respect to the rotation axis AX and the direction A of the sliding movement.

As illustrated in FIG. 8, as the angle of the rotational movement of the magnet 123 in the clockwise direction B2 increases, the angle indicating the direction of the magnetic field generated by the magnet 123 on the XY plane, which is detected by the first magnetic sensor 124A, increases to the positive value side.

As illustrated in FIG. 8, as the angle of the rotational movement of the magnet 123 in the counterclockwise direction B1 increases, the angle indicating the direction of the magnetic field generated by the magnet 123 on the XY plane, which is detected by the first magnetic sensor 124A, increases to the negative value side.

Similarly, as illustrated in FIG. 9, as the angle of the rotational movement of the magnet 123 in the clockwise direction B2 increases, the angle indicating the direction of the magnetic field generated by the magnet 123 on the XY plane, which is detected by the second magnetic sensor 124B, increases to the positive value side.

As illustrated in FIG. 9, as the angle of the rotational movement of the magnet 123 in the counterclockwise direction B1 increases, the angle indicating the direction of the magnetic field generated by the magnet 123 on the XY plane, which is detected by the second magnetic sensor 124B, increases to the negative value side.

Therefore, the determination unit 132 of the control device 130 determines that "the rotation operation in the clockwise direction B2 by the rotation operation knob 111 has been performed" when the detection value of the first magnetic sensor 124A increases to the positive value side and the detection value of the second magnetic sensor 124B increases to the positive value side, and thus it is possible to determine that the rotation operation in the clockwise direction B2 by the rotation operation knob 111 has been performed with high accuracy. That is, by multiplexing the magnetic sensors 124, an erroneous determination may be reduced when a magnetic sensor fails or the like.

Further, the determination unit 132 of the control device 130 determines that "the rotation operation in the counterclockwise direction B1 by the rotation operation knob 111 has been performed" when the detection value of the first magnetic sensor 124A increases to the negative value side and the detection value of the second magnetic sensor 124B increases to the negative value side, and thus it is possible to determine that the rotation operation the in counterclockwise direction B1 by the rotation operation knob 111 has been performed with high accuracy. That is, an erroneous determination may be reduced by multiplexing the magnetic sensors 124 when the magnetic sensors 124 fail or the like.

Further, the determination unit 132 of the control device 130 can determine the angle of the rotational movement of the magnet 123 in the clockwise direction B2 or the counterclockwise direction B1 with high accuracy using a predetermined conversion formula or a predetermined conversion table based on at least one of the detection value of the first magnetic sensor 124A (i.e., the angle indicating the direction of the magnetic field) or the detection value of the second magnetic sensor 124B (i.e., the angle indicating the direction of the magnetic field). That is, an erroneous determination may be reduced by multiplexing the magnetic sensors 124 when the magnetic sensors 124 fail or the like.

As illustrated in FIGS. 8 and 9, when the inclination angle θ of the magnetization directions of the N pole and the S pole of the magnet 123 is 45 degrees with respect to the rotation axis AX and the direction of the sliding movement, the detection value of the first magnetic sensor 124A (i.e., the angle indicating the direction of the magnetic field) and the detection value of the second magnetic sensor 124B (i.e., the angle indicating the direction of the magnetic field) change substantially linearly with respect to the rotational movement of the magnet 123 when the angle of the rotational movement of the magnet 123 is 30 degrees or less in both directions from the initial state.

On the other hand, as is clear from FIG. 10 illustrating a relationship between the actual rotation angle of the magnet 123 and the detection value of the magnetic sensor 124 when the inclination angle θ of the magnetization directions of the N pole and the S pole is changed from 45 degrees, when the inclination angle θ is set to be smaller than 45 degrees, the amount of change from the initial detection value of the magnetic sensor 124 becomes smaller than that in the case of 45 degrees, which makes it difficult to determine the amount of rotation operation. Further, when the inclination angle θ is set to be larger than 45 degrees, the detection value of the magnetic sensor 124 becomes larger than the actual rotation angle in a range in which the amount of rotation operation is small from the initial state, but the amount of change gradually decreases thereafter, and there is no linearity as a whole, which makes it difficult to determine the operation position in the middle.

Therefore, the input device 100 according to the first embodiment sets the inclination angle θ of the magnetization directions of the N pole and the S pole of the magnet 123 to 45 degrees with respect to the rotation axis AX and the direction A of the sliding movement, physically regulates the rotation operation angle by the rotation operation knob 111 such that the rotational movement angle of the magnet 123 becomes 30 degrees or less in both directions from the initial state, which makes it possible to accurately detect the operation position in the middle.

(Example of Sliding Movement of Magnet 123)

Figure 11A:
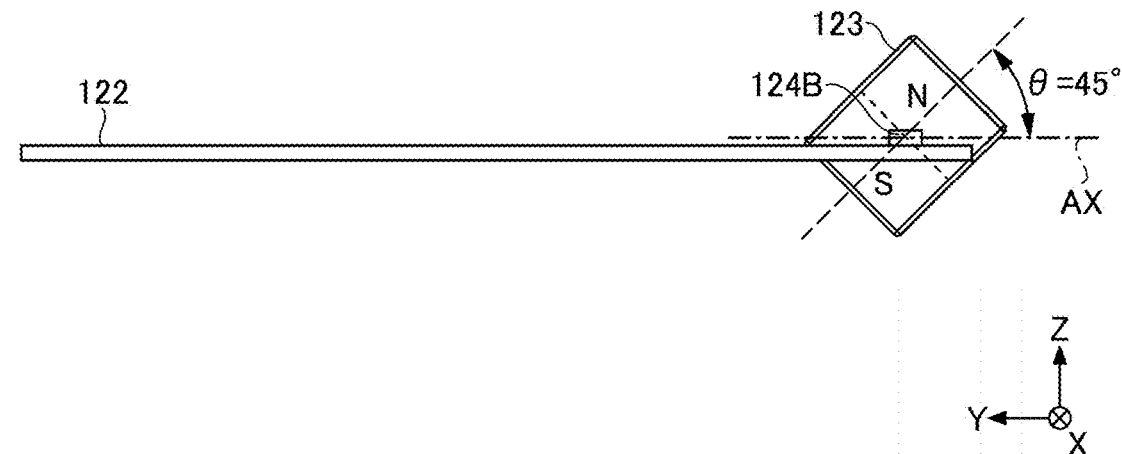
FIG. 11A is a view illustrating an example of a sliding movement of a magnet during a push operation in the input device according to the first embodiment.
Figure 11B:
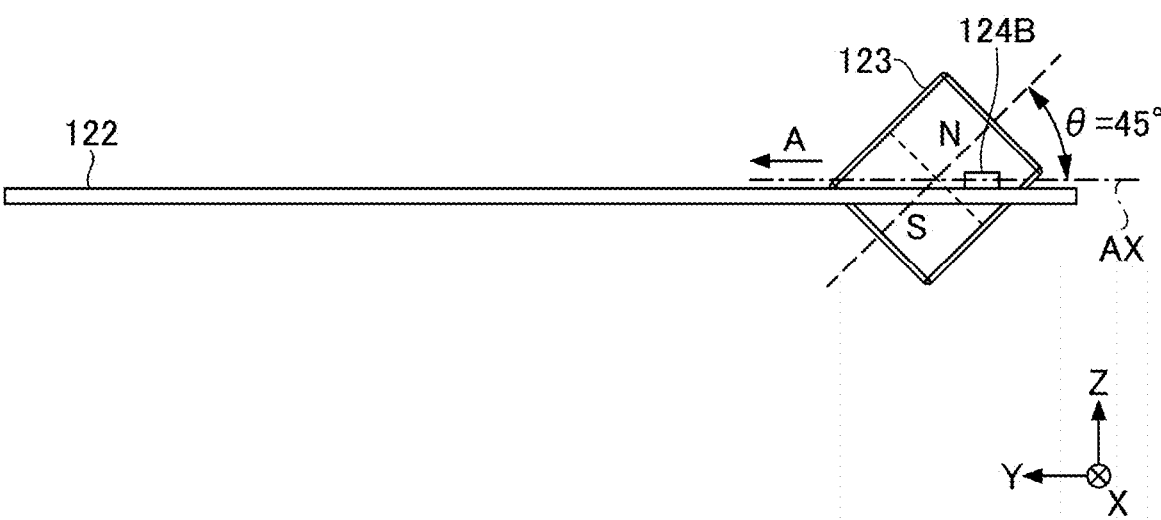
FIG. 11B is a view illustrating an example of a sliding movement of the magnet during the push operation in the input device according to the first embodiment.

FIGS. 11A and 11B are diagrams each illustrating an example of the sliding movement of the magnet 123 during a push operation in the input device 100 according to the first embodiment. FIG. 11A illustrates a state before the magnet 123 is slid (i.e., an initial state). FIG. 11B illustrates a state after the magnet 123 is slid.

As illustrated in FIGS. 11A and 11B, the input device 100 according to the first embodiment can slide in the direction A (Y-axis positive direction) parallel to the rotation axis AX with the inclination angle θ of the magnetization directions of the N pole and the S pole of the magnet 123 in the initial state inclined by 45 degrees counterclockwise with respect to the rotation axis AX and the direction A of the sliding movement as viewed from the negative X-axis side in accordance with the push operation by the push operation knob 112.

The input device 100 according to the first embodiment can detect the direction of the magnetic field generated by the magnet 123, which changes when the magnet 123 slides, by the first magnetic sensor 124A and the second magnetic sensor 124B provided on the substrate 122.

Here, in the input device 100 according to the first embodiment, GMR sensors are used as the first magnetic sensor 124A and the second magnetic sensor 124B. Therefore, the first magnetic sensor 124A and the second magnetic sensor 124B can detect the direction of the magnetic field generated by the magnet 123 on the XY plane, which changes when the magnet 123 slide.

In this case, as the amount of sliding movement of the magnet 123 in the direction A increases, the relative angle of the magnet 123 with respect to each of the first magnetic sensor 124A and the second magnetic sensor 124B increases. Therefore, the angle indicating the direction of the magnetic field detected by the first magnetic sensor 124A and the second magnetic sensor 124B increases as the amount of sliding movement of the magnet 123 in the direction A increases.

However, the first magnetic sensor 124A and the second magnetic sensor 124B are disposed on the substrate 122 so as to face in opposite directions from each other relative to the magnet. Therefore, in the input device 100 according to the first embodiment, as illustrated in FIGS. 12 and 13, the detection value of one of the two magnetic sensors 124A and 124B increases to the positive value side with the sliding movement of the magnet 123, and the detection value of the other of the two magnetic sensors 124A and 124B increases to the negative value side with the sliding movement of the magnet 123.

(Example of Detection Values of Magnetic Sensors 124A and 124B During Push Operation)

Figure 12:
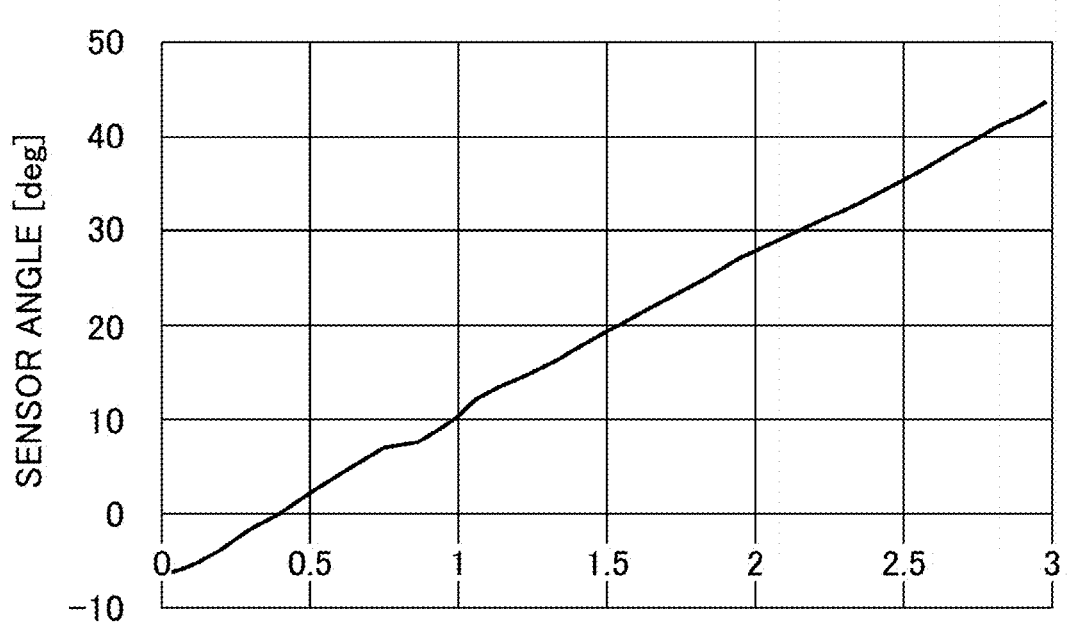
FIG. 12 is a diagram illustrating an example of a detection value of a first magnetic sensor during a push operation in the input device according to the first embodiment.

FIG. 12 is a diagram illustrating an example of the detection value of the first magnetic sensor 124A during the push operation in the input device 100 according to the first embodiment. FIG. 13 is a diagram illustrating an example of the detection value of the second magnetic sensor 124B during the push operation in the input device 100 according to the first embodiment.

As illustrated in FIG. 12, as the amount of sliding movement of the magnet 123 in the direction A of sliding movement increases, the angle indicating the direction of the magnetic field generated by the magnet 123 on the XY plane, which is detected by the first magnetic sensor 124A, increases to the positive value side.

Figure 13:
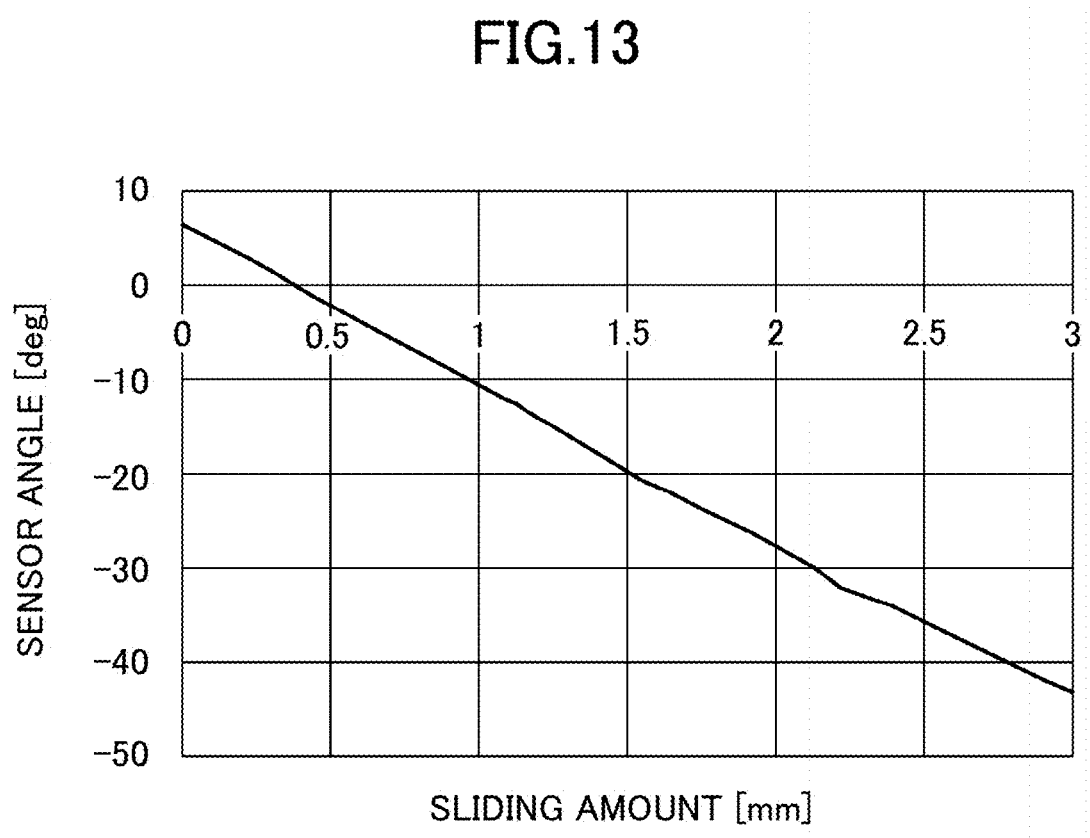
FIG. 13 is a diagram illustrating an example of a detection value of a second magnetic sensor during the push operation in the input device according to the first embodiment.

On the other hand, as illustrated in FIG. 13, as the amount of sliding movement of the magnet 123 in the direction A of sliding movement increases, the angle indicating the direction of the magnetic field generated by the magnet 123 on the XY plane, which is detected by the second magnetic sensor 124B, increases to the negative value side.

Therefore, the determination unit 132 of the control device 130 determines that "the push operation by the push operation knob 112 has been performed" when the detection value of the first magnetic sensor 124A increases to the positive value side and the detection value of the second magnetic sensor 124B increases to the negative value side, which makes it possible to determine that the push operation by the push operation knob 112 has been performed with high accuracy. That is, an erroneous determination may be reduced by multiplexing the magnetic sensors 124 when the magnetic sensors 124 fail or the like.

The determination unit 132 of the control device 130 can determine the amount of sliding movement of the magnet 123 in the direction A of sliding movement (i.e., the amount of pushing of the push operation knob 112) with high accuracy using a predetermined conversion formula or a predetermined conversion table based on at least one of the detection value of the first magnetic sensor 124A (i.e., the angle indicating the direction of the magnetic field) and the detection value of the second magnetic sensor 124B (i.e., the angle indicating the direction of the magnetic field). That is, by installing only one of the magnetic sensors 124, the space and cost can be reduced.

Effects

As described above, the input device 100 according to the first embodiment includes the operation unit 110 configured to perform a rotation operation and a push operation; the magnet 123 provided rotationally movable in response to the rotation operation and slidably movable in response to the push operation from the initial state, the magnetic sensor 124 disposed on the substrate 122 and detecting the magnetic field generated by the magnet 123, and the determination unit 132 determining the operation content of the rotation operation and the operation content of the push operation based on the detection result of the magnetic sensor 124. The magnet 123 is disposed such that the rotation axis AX, which is the center of rotation when performing the rotational movement, passes through the magnet 123, and the direction of the magnetic field generated by the magnet 123 is inclined with respect to the rotation axis AX of the rotational movement and the direction A of the slide movement.

Thus, the input device 100 according to the first embodiment can detect the movement of the magnet 123 associated with the operation of the operation unit 110 as a change in the direction of the magnetic field regardless of whether the rotation operation or the push operation is performed, and thus can detect both the rotation operation and the push operation by at least one magnetic sensor 124. Therefore, the input device 100 according to the first embodiment, can detect each of the rotation operation and the push operation with high accuracy by using a small number of magnetic sensors 124.

The input device 100 according to the first embodiment includes the magnetic sensor 124 having two magnetic sensors 124, and the two magnetic sensors 124 are disposed on the substrate 122 such that the detection value of one magnetic sensor 124 of the two magnetic sensors 124 increases to the positive value side with the sliding movement and the detection value of the other magnetic sensor 124 of the two magnetic sensors 124 increases to the negative value side with the sliding movement.

Thus, the input device 100 according to the first embodiment can determine that the push operation has been performed with higher accuracy when the detection values of the two magnetic sensors 124 increase in opposite directions.

In the input device 100 according to the first embodiment, the substrate 122 is disposed in parallel to the rotation axis AX of the rotational movement and the direction A of the sliding movement.

Thus, the input device 100 according to the first embodiment can bring the magnet 123 and the detection surface of the magnetic sensor 124 in close proximity and facing each other when the rotation operation and the push operation are performed, and thus can increase the detection sensitivity of the magnetic sensor 124.

In the input device 100 according to the first embodiment, the substrate 122 has the cutout portion 122A, where the cutout portion 122A has the magnet 123 disposed inside the cutout portion 122A, and the substrate 122 does not interfere with the rotational movement and the sliding movement of the magnet 123.

Thus, in the input device 100 according to the first embodiment, the magnet 123 can be disposed inside the outer frame of the substrate 122 without causing the magnet 123 to interfere with the substrate 122, thereby implementing the miniaturization of the entire input device 100.

In the input device 100 according to the first embodiment, the magnetic sensor 124 is disposed at a position overlapping the magnet 123 in the initial state standing by inside the cutout portion 122A when viewed from the direction parallel to the substrate 122 and the direction orthogonal to the rotation axis AX.

Thus, in the input device 100 according to the first embodiment, the magnet 123 and the magnetic sensor 124 can be brought close to each other in the thickness direction of the substrate 122, and thus the detection sensitivity of the magnetic sensor 124 can be increased.

In the input device 100 according to the first embodiment, the magnetic sensor 124 is disposed on a side of the cutout portion 122A in the substrate 122 in close proximity to and facing the magnet 123 in the initial state standing by inside the cutout portion 122A.

Thus, in the input device 100 according to the first embodiment, the magnet 123 and the magnetic sensor 124 can be brought close to each other in the horizontal direction of the substrate 122, and thus the detection sensitivity of the magnetic sensor 124 can be increased.

In the input device 100 according to the first embodiment, the angle of the rotational movement of the magnet 123 is 30 degrees or less in both directions from the initial state, and the angle $\theta$ of the inclination of the magnetization directions of the N pole and the S pole of the magnet 123 with respect to the rotation axis AX is 45 degrees.

Thus, the input device 100 according to the first embodiment can change the detection value of the magnetic sensor 124 substantially linearly within the range of the rotational movement of the magnet 123, and thus can determine the angle of the rotation operation based on the detection value of the magnetic sensor 124 with high accuracy.

Second Embodiment (Configuration of Input Device 100-2)

Figure 14:
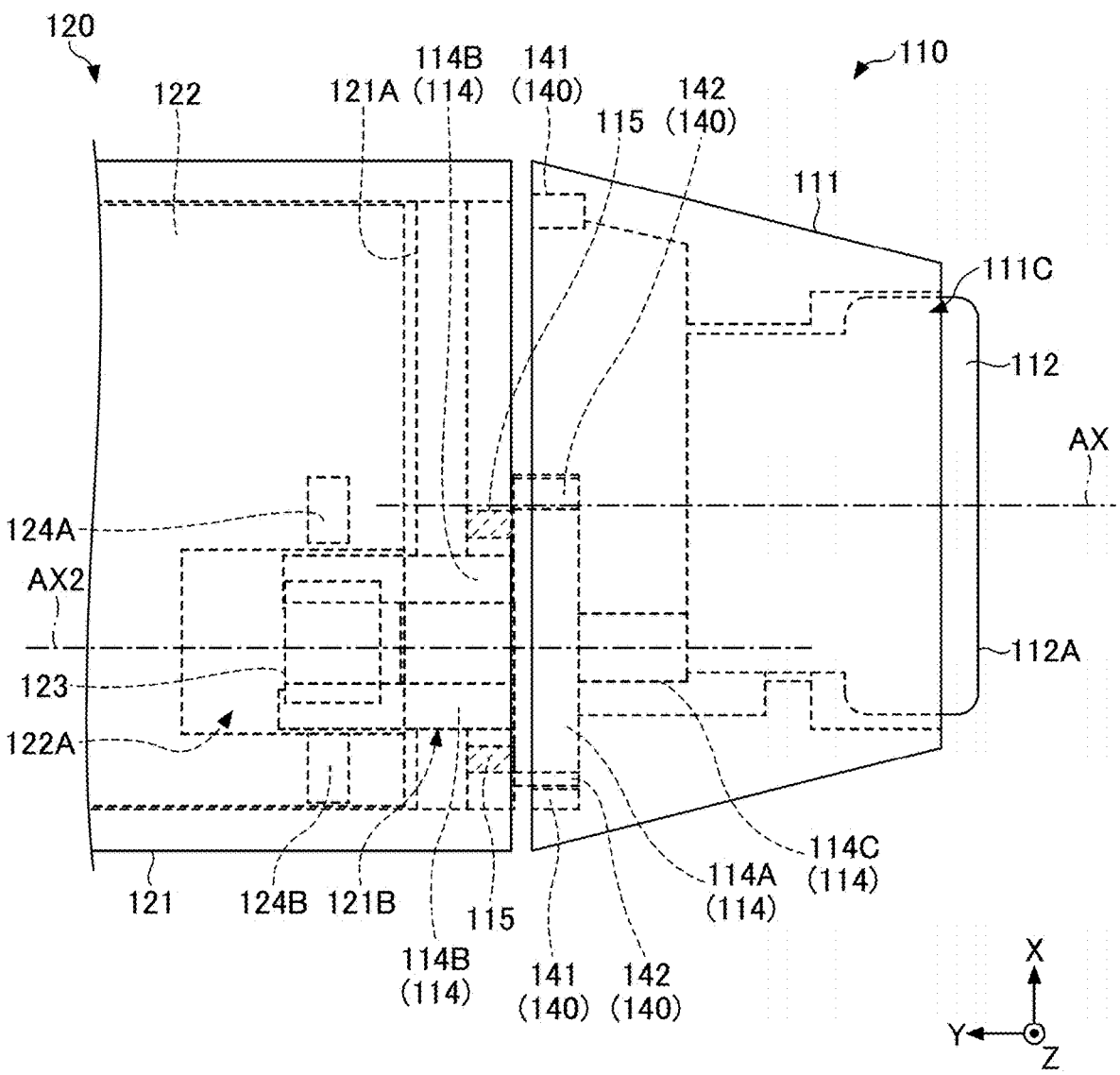
FIG. 14 is a plan view illustrating an input device according to a second embodiment.
Figure 15:
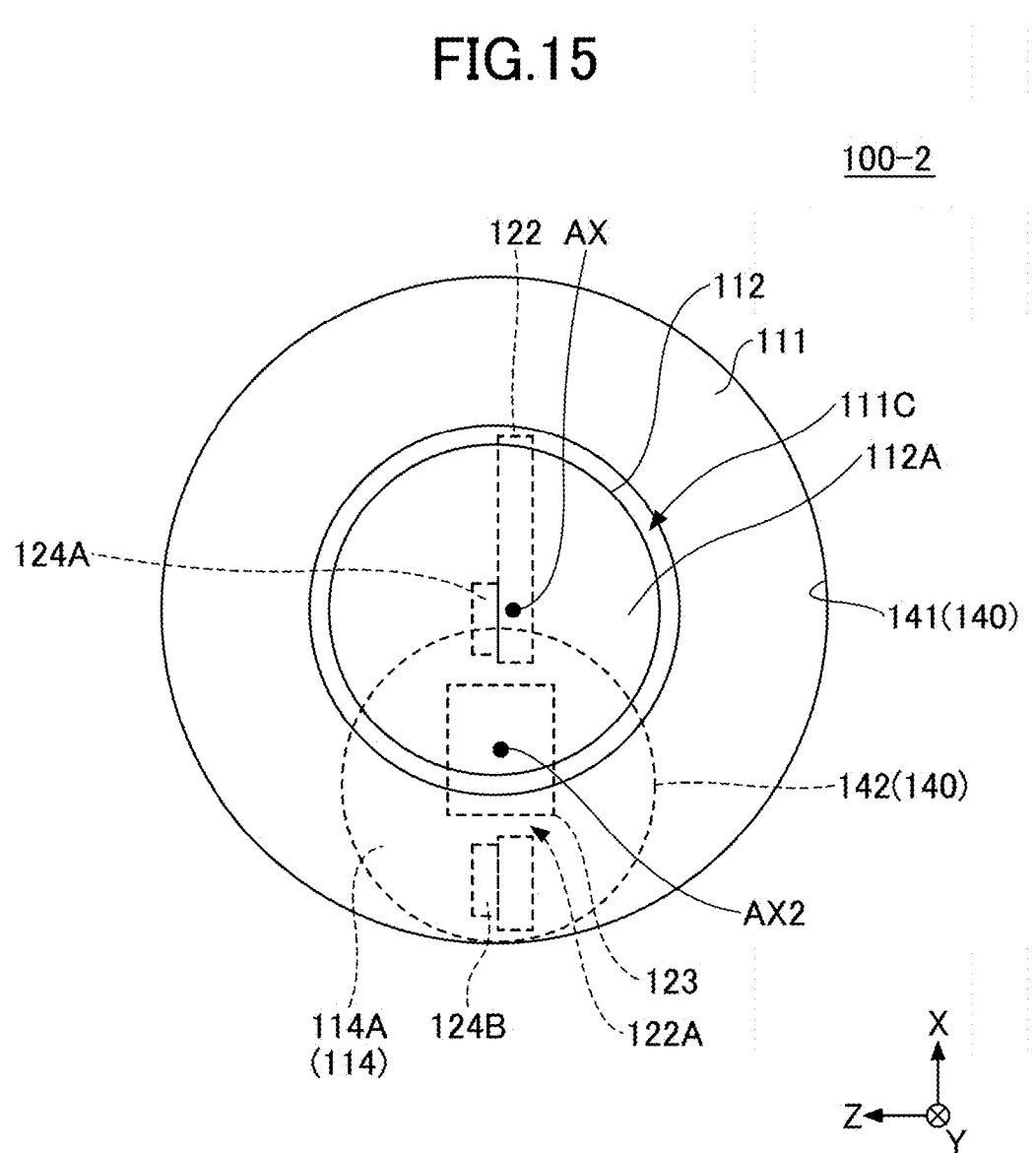
FIG. 15 is a front view illustrating the input device according to the second embodiment.

FIG. 14 is a plan view illustrating an input device 100-2 according to a second embodiment. FIG. 15 is a front view illustrating the input device 100-2 according to the second embodiment. Hereinafter, regarding the input device 100-2 according to the second embodiment, changes from the input device 100 according to the first embodiment will be described.

As illustrated in FIGS. 14 and 15, in the input device 100-2 according to the second embodiment, internal gears 141 are provided over the entire circumference of an inner circumferential surface of an opening on the front side (Y-axis positive side) of the rotation operation knob 111.

In the input device 100-2 according to the second embodiment, external gears 142 are provided entire over the circumference of an outer circumferential surface of the rotation portion 114A of the retainer 114. The retainer 114 is rotationally and slidably supported such that the rotation portion 114A is disposed inside the internal gears 141 of the rotation operation knob 111, and the external gears 142 of the rotation portion 114A are always engaged with the internal gears 141 of the rotation operation knob 111.

Therefore, a second rotation axis AX2, which is the center of rotation of the retainer 114, is located outside of the rotation axis AX, which is the center of rotation of the rotation operation knob 111, in the radial direction.

Accordingly, the magnet 123, the cutout portion 122A, the first magnetic sensor 124A, and the second magnetic sensor 124B are provided at positions shifted to the left side (negative X-axis side) from the center in the horizontal direction (X-axis direction) on the substrate 122 such that the rotation axis serving as the rotation center when the rotational movement passing through the magnet 123 is performed becomes the second rotation axis AX2.

The input device 100-2 according to the second embodiment includes a speed increasing mechanism 140 configured to increase the rotation speed of the retainer 114 to be higher than the rotation speed of the rotation operation knob 111 by causing the internal gears 141 of the rotation operation knob 111 to rotationally drive the external gears 142 of the retainer 114 having a smaller number of teeth than the internal gears 141.

Thus, even when the rotation operation knob 111 performs the rotation operation of a small rotation angle, the input device 100-2 according to the second embodiment can increase the rotation angle of the magnet 123 by increasing the rotation speed of the retainer 114 to be higher than the rotation speed of the rotation operation knob 111, and the input device 100-2 thus can increase the detection sensitivity of the magnetic sensors 124.

In particular, the input device 100-2 according to the second embodiment adopts a configuration in which the speed increasing mechanism 140 includes the external gears 142 disposed on the retainer 114 and the internal gears 141 disposed on the rotation operation knob 111, and the external gears 142 are driven at an increased speed by the internal gears 141 during the rotation operation. Therefore, in the input device 100-2 according to the second embodiment, the speed increasing mechanism 140 can be disposed with high space efficiency, and the speed of the rotation operation can be reliably increased.

Although the embodiments of the present disclosure have been described in detail, the present disclosure is not limited to these embodiments, and various modifications or changes can be made within the scope of the gist of the present disclosure described in the claims.

For example, the two magnetic sensors 124 are not limited to those disposed on one surface of the substrate 122 to face each other with the magnet 123 interposed therebetween, and may be disposed on both surfaces of the substrate 122 on one side of the magnet 123.

Further, for example, only one magnetic sensor 124 may be disposed on one side of the magnet 123.

For example, the magnetic sensor 124 is not limited to the GMR sensor, and may be another magnetic sensor (e.g., a Hall device or a 3D sensor) as long as the magnetic sensor can detect at least the direction of the magnetic field.

Further, for example, the cutout portion 122A of the substrate 122 is not limited to that having a shape in which a part of the peripheral edge portion is opened (i.e., a cutout shape), and may have a shape in which the peripheral edge portion is closed (i.e., an opening shape).

According to the embodiment of the present disclosure, the two magnetic sensors 124 are disposed on the substrate 122 such that the detection value of one magnetic sensor 124 of the two magnetic sensors 124 increases to the positive value side in accordance with the sliding movement, and the detection value of the other magnetic sensor 124 of the two magnetic sensors 124 increases to the negative value side in accordance with the sliding movement. However, the present disclosure is not limited to this example. For example, the two magnetic sensors 124 may be disposed on the substrate 122 such that both the detection values of the two magnetic sensors 124 increase in the same direction of the positive value side or the negative value side in accordance with the sliding movement. In this case, the detection value of one magnetic sensor 124 of the two magnetic sensors 124 can be increased to the positive value side with the rotational movement, and the detection value of the other magnetic sensor 124 of the two magnetic sensors 124 can be increased to the negative value side with the rotational movement.

What is claimed is:

1. An input device, comprising:
an operation nob configured to perform a rotation operation and a push operation;
a magnet provided so as to perform a rotational movement in response to the rotation operation and to perform a sliding movement in response to the push operation, from an initial state;
a first magnetic sensor and a second magnetic sensor spaced apart from each other, the magnet interposed between the first magnetic sensor and the second magnetic sensor, the first magnetic sensor and the second magnetic sensor configured to detect a magnetic field generated by the magnet; and
circuitry configured to determine operation content of the rotation operation and operation content of the push operation based on detection results of the first magnetic sensor and the second magnetic sensor,
wherein the magnet is disposed such that a rotation axis serving as a rotation center when performing the rotational movement passes through the magnet, and magnetization directions of an N pole and an S pole of the magnet are inclined with respect to the rotation axis of the rotational movement and a direction of the sliding movement.

2. The input device according to claim 1,
wherein the first magnetic sensor and the second magnetic sensor are disposed such that a detection value of one of the first magnetic sensor and the second magnetic sensor increases to a positive value side in accordance with the sliding movement, and a detection value of another of the first magnetic sensor and the second magnetic sensor increases to a negative value side in accordance with the sliding movement.

3. The input device according to claim 1, wherein
the first magnetic sensor and the second magnetic sensor are disposed on a substrate, and
the substrate is disposed in parallel to the rotation axis of the rotational movement and the direction of the sliding movement.

4. An input device comprising:
an operation nob configured to perform a rotation operation and a push operation;
a magnet provided so as to perform a rotational movement in response to the rotation operation and to perform a sliding movement in response to the push operation, from an initial state;
a magnetic sensor disposed on a substrate and configured to detect a magnetic field generated by the magnet; and
circuitry configured to determine operation content of the rotation operation and operation content of the push operation based on a detection result of the magnetic sensor,
wherein the magnet is disposed such that a rotation axis serving as a rotation center when performing the rotational movement passes through the magnet, and magnetization directions of an N pole and an S pole of the magnet are inclined with respect to the rotation axis of the rotational movement and a direction of the sliding movement,
wherein the substrate has a cutout portion, and
wherein the magnet is disposed inside the cutout portion when viewed from a direction orthogonal to the substrate, and the cutout portion does not interfere with the rotational movement and the sliding movement of the magnet.

5. The input device according to claim 4, wherein
the magnetic sensor is disposed at a position overlapping the magnet in an initial state standing by inside the cutout portion when viewed from a direction parallel to the substrate and a direction orthogonal to the rotation axis of the rotational movement.

6. The input device according to claim 4, wherein
the magnetic sensor is disposed in proximity to and facing the magnet in an initial state standing by inside the cutout portion at a position on a side of the cutout portion in the substrate when viewed from a direction orthogonal to the substrate.

7. The input device according to claim 1, wherein
an angle of the rotational movement of the magnet is 30 degrees or less in both directions from the initial state, and
an angle of inclination of the magnetization directions of the N pole and the S pole of the magnet with respect to the rotation axis and the direction of the sliding movement is 45 degrees.

8. An input device, comprising:
an operation nob configured to perform a rotation operation and a push operation;
a magnet provided so as to perform a rotational movement in response to the rotation operation and to perform a sliding movement in response to the push operation, from an initial state;
a magnetic sensor configured to detect a magnetic field generated by the magnet;
circuitry configured to determine operation content of the rotation operation and operation content of the push operation based on a detection result of the magnetic sensor;

a retainer configured to retain the magnet and be supported to be rotatable and slidable with respect to the operation nob; and a speed increasing mechanism configured to increase a rotation speed of the retainer to be greater than a rotation speed of the operation nob during the rotation operation, wherein the magnet is disposed such that a rotation axis serving as a rotation center when performing the rotational movement passes through the magnet, and magnetization directions of an N pole and an S pole of the magnet are inclined with respect to the rotation axis of the rotational movement and a direction of the sliding movement.

9. The input device according to claim 8, wherein the speed increasing mechanism includes external gears provided on the retainer; and internal gears provided in the operation nob, and wherein the external gears are driven at an increased speed by the internal gears during the rotation operation.

\*  \*  \*  \*  \*